United States Patent
Hamouda

(10) Patent No.: US 9,672,311 B2
(45) Date of Patent: Jun. 6, 2017

(54) METHOD AND SYSTEM FOR VIA RETARGETING

(71) Applicant: GLOBALFOUNDRIES Inc., Grand Cayman (KY)

(72) Inventor: Ayman Hamouda, Fishkill, NY (US)

(73) Assignee: GlobalFoundries Inc., Grand Cayman (KY)

( * ) Notice: Subject to any disclaimer, the term of this patent is extended or adjusted under 35 U.S.C. 154(b) by 277 days.

(21) Appl. No.: 14/469,886

(22) Filed: Aug. 27, 2014

(65) Prior Publication Data

US 2016/0063167 A1  Mar. 3, 2016

(51) Int. Cl.
*G06F 17/50* (2006.01)
*H01L 23/522* (2006.01)

(52) U.S. Cl.
CPC ...... *G06F 17/5072* (2013.01); *G06F 17/5068* (2013.01); *G06F 17/5081* (2013.01); *H01L 23/5226* (2013.01)

(58) Field of Classification Search
CPC .... G03F 7/70; G06F 17/5045; G06F 17/5068; G06F 17/5081
USPC ............. 716/52–55, 100, 106, 110–112, 122
See application file for complete search history.

(56) References Cited

U.S. PATENT DOCUMENTS

| 7,784,019 | B1 |  | 8/2010 | Zach |
| 8,793,627 | B1 | * | 7/2014 | Stephens ............. G06F 17/5081 716/122 |
| 8,839,168 | B2 | * | 9/2014 | Kye et al. ...................... 716/110 |
| 8,863,048 | B1 | * | 10/2014 | Gerousis ............. G06F 17/5072 716/100 |
| 2012/0272201 | A1 |  | 10/2012 | Lai et al. |
| 2014/0215421 | A1 | * | 7/2014 | Chen ................... G06F 17/5081 716/112 |

\* cited by examiner

*Primary Examiner* — Paul Dinh
(74) *Attorney, Agent, or Firm* — Williams Morgan, P.C.

(57) ABSTRACT

Embodiments of the present invention provide a system and method for SAV (self-aligned via) retargeting. The SAV (Self Aligned Vias) process aids in the alignment of the vias with the metal above (Mx+1) during the dual damascene process. The retargeting enables an increase the area of the via during photolithography without affecting the final critical dimension. SAV retargeting is the via retargeting during the mask tape-out to reshape the via and protect it against possible via-to-Mx+1 overlay error. With embodiments of the present invention, the via edge movement is linked to the actual driver behind the SAV retargeting, which is maintaining a minimum area coverage with the metal above at extreme overlay error conditions. Accordingly, for a via edge to get SAV retargeted, a calculation is first made to determine how much its opposite via edge is subject to be cut during SAV due to overlay error.

20 Claims, 9 Drawing Sheets

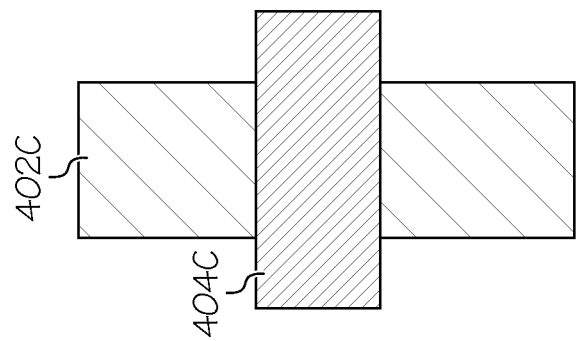
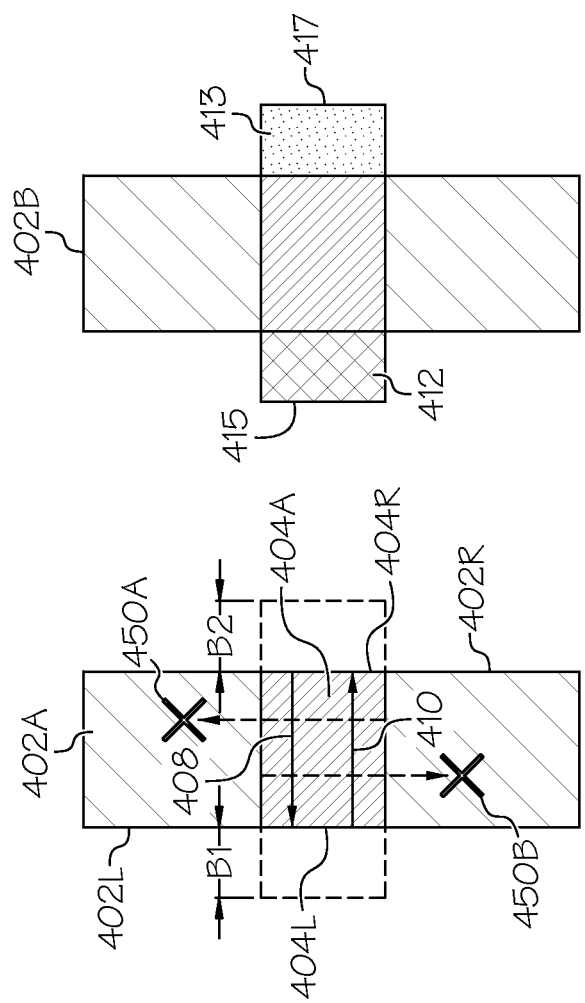
FIG. 4C
FIG. 4B
FIG. 4A

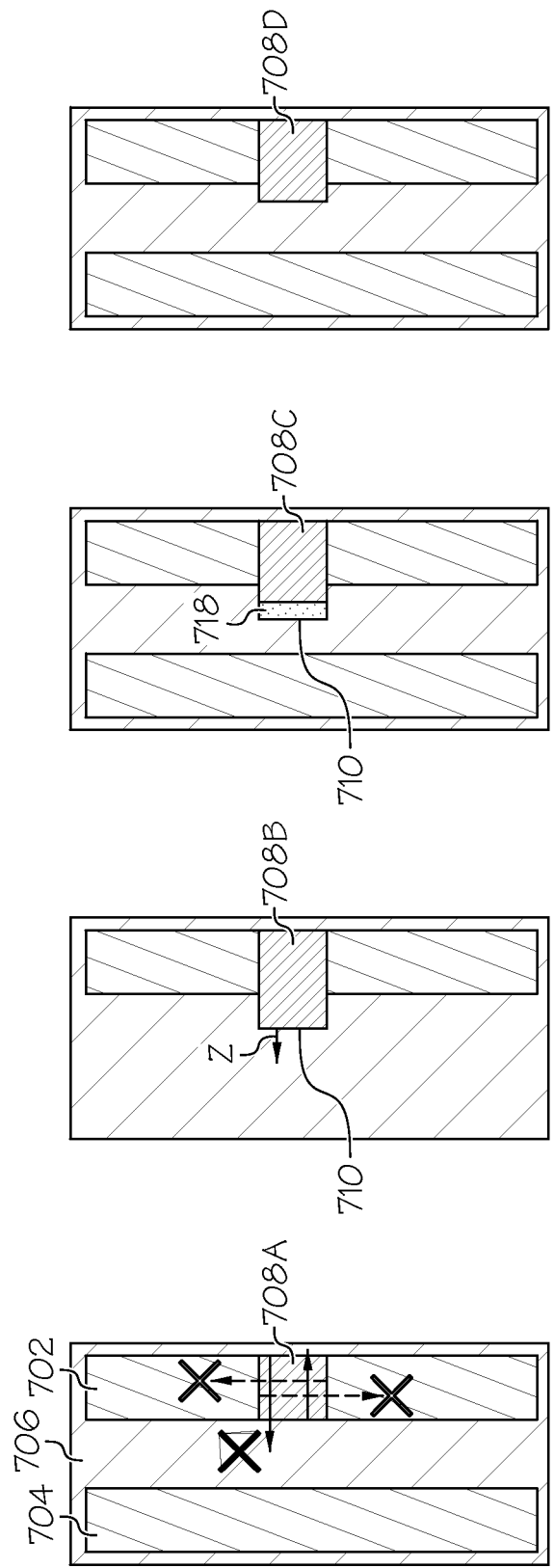

METHOD AND SYSTEM FOR VIA RETARGETING

FIELD OF THE INVENTION

The present invention relates generally to semiconductor fabrication and, more particularly, to a method and system for via retargeting.

BACKGROUND

As the trend in semiconductors continues towards reduced critical dimensions, integrated circuits involving millions of transistors on a single chip have become commonplace. Due to the large number of devices on a single chip, an entire industry has evolved specifically to supply the semiconductor industry with software and hardware tools to automate much of the process of integrated circuit design.

Electronic design automation (EDA) tools are computer-based tools that assist through automation of procedures that would otherwise be performed manually. Simulation of proposed design functionality and synthesis of integrated circuit logic and layout are two examples.

In semiconductor integrated circuit fabrication, a contact is formed to electrically connect an active region or a conductive layer formed in a semiconductor substrate with a metal interconnect line formed on a dielectric layer disposed between the interconnect line and the substrate. In a back end of line (BEOL) structure, many metallization levels may be interconnected by via levels. With development of high density integrated circuit technology, more components require placement on a chip, increasing complexity of the fabrication process, including the design and placement of vias. EDA tools provide valuable assistance in this regard. However, challenges still remain regarding appropriate via sizing and placement. It is therefore desirable to have improvements to address the aforementioned challenges.

SUMMARY

Embodiments of the present invention provide a system and method for SAV (self-aligned via) retargeting. The SAV retargeting process aids in the alignment of the vias with the metal above (Mx+1) during the dual damascene process. The retargeting enables an increase in the area of the via during photolithography without affecting the final critical dimension. SAV retargeting is the via retargeting during the mask tape-out to reshape the via and protect it against possible via-to-Mx+1 overlay error. In embodiments of the present invention, the via edge movement is linked to the actual driver behind the SAV retargeting, which is maintaining a minimum area coverage with the metal above at extreme overlay error conditions. Accordingly, for a via edge to get SAV retargeted, a calculation is first made to determine how much its opposite via edge is subject to be cut during SAV due to overlay error.

In a first aspect, embodiments of the present invention provide a method of retargeting a self-aligned via having a plurality of edges, comprising: a) selecting a first edge of the via; b) obtaining a maximum bias value for the via; c) obtaining a via width; d) using a computer to compute a distance from the first edge to an opposite parallel Mx+1 edge; e) expanding the first edge of the via outward by an amount of the maximum bias value plus the via width minus the distance from the first edge to an opposite parallel Mx+1 edge in response to determining that the distance from the first edge to an opposite parallel Mx+1 edge is greater than the via width plus the maximum bias value; and f) repeating steps d) and e) for each additional edge of the plurality of edges.

In a second aspect, embodiments of the present invention provide a system for designing an integrated circuit, comprising one or more processors coupled to memory containing machine instructions, that when executed by the one or more processors, perform the functions of: a) selecting a first edge of a via that has a plurality of edges; b) obtaining a maximum bias value for the via; c) obtaining a via width; d) computing a distance from the first edge to an opposite parallel Mx+1 edge; e) expanding the first edge of the via outward by an amount of the maximum bias value plus the via width minus the distance from the first edge to an opposite parallel Mx+1 edge in response to determining that the distance from the first edge to an opposite parallel Mx+1 edge is greater than the via width plus the maximum bias value; and f) repeating steps d) and e) for each additional edge of the plurality of edges.

In a third aspect, embodiments of the present invention provide a computer program product embodied in a computer-readable medium for designing an integrated circuit, comprising instructions for: a) selecting a first edge of a via that has a plurality of edges; b) obtaining a maximum bias value for the via; c) obtaining a via width; d) computing a distance from the first edge to an opposite parallel Mx+1 edge; e) expanding the first edge of the via outward by an amount of the maximum bias value plus the via width minus the distance from the first edge to an opposite parallel Mx+1 edge in response to determining that the distance from the first edge to an opposite parallel Mx+1 edge is greater than the via width plus the maximum bias value; and f) repeating steps d) and e) for each additional edge of the plurality of edges.

BRIEF DESCRIPTION OF THE DRAWINGS

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

FIGS. 4A-4C illustrate an exemplary retargeting process in accordance with illustrative embodiments.

FIGS. 7A-7D illustrate an exemplary Mx design rule check process in accordance with illustrative embodiments.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, are interchangeable and specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," "some embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment. It will be understood that one skilled in the art may cross embodiments by "mixing and matching" one or more features of one embodiment with one or more features of another embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

Figure 1B:
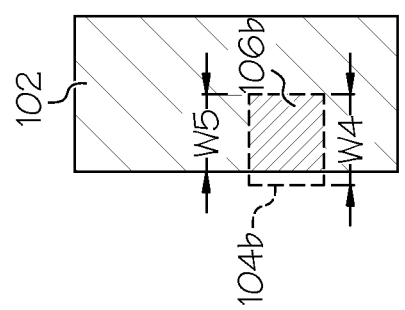
FIG. 1B shows a bottom-up view of an exemplary via after retargeting in accordance with illustrative embodiments.
Figure 1A:
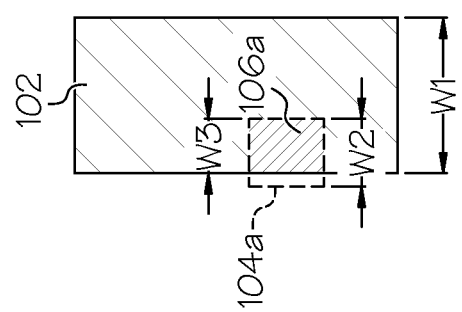
FIG. 1A shows a bottom-up view of an exemplary via prior to retargeting.

FIG. 1A shows a bottom-up view of an exemplary via prior to retargeting. Metal line (Mx+1) 102 is shown with ideal via zone 104a thereon. Metal line (Mx+1) 102 has a width W1. In embodiments, W1 may range from about 25 nanometers to about 100 nanometers. The ideal via zone 104a has a width W2. In embodiments, W2 may range from about 5 nanometers to about 20 nanometers. The portion of the idea via zone 104a which overlaps with metal line (Mx+1) 102 is the overlap region 106a. Overlap region 106a has a width W3. In embodiments, W3 may range from about 70 percent to about 95 percent of the value of W2.

FIG. 1B shows a bottom-up view of an exemplary via after retargeting in accordance with illustrative embodiments. During retargeting, the width of the ideal via zone 104a (FIG. 1A) and the overlap region 106a (FIG. 1A) each changed. Accordingly, the width of the expanded ideal via zone 104b is W4, and the width of the expanded overlap zone 106b is W5. In embodiments, W4 may range from about 5 percent larger than W2 to about 30 percent larger than W2, and W5 may range from about 70 percent to about 95 percent of the value of W4.

Figure 2C:
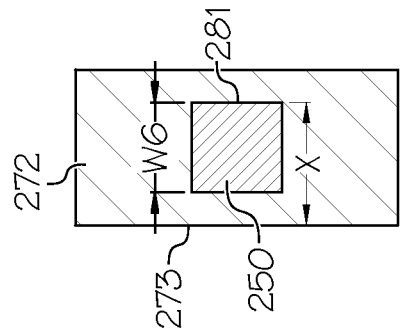
FIG. 2C indicates an example of opposite edge distance.
Figure 2B:
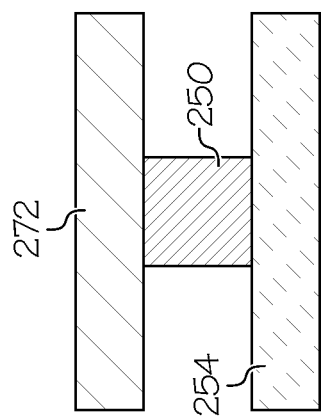
FIG. 2B shows an example of a via between two metal layers.
Figure 2A:
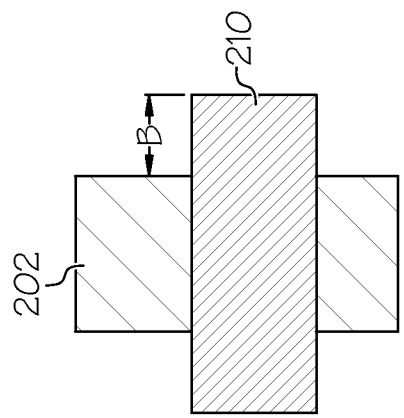
FIG. 2A shows an example of maximum via bias.

FIG. 2A shows an example of maximum via bias. As depicted, via 210 over metal line (Mx+1) 202 has a maximum via bias B. Maximum via bias is an amount beyond the maximum overlay error to which the via may be sized.

FIG. 2B shows an example of a via between two metal layers. Depicted is a side view of a via 250 disposed as a contact between metal line (Mx+1) 272 and metal line (Mx) 254.

FIG. 2C indicates an example of opposite edge distance. FIG. 2C is a bottom-up view of via 250 and line 272 without line 254. A metal line (Mx+1) 272 and via 250 are depicted. Metal line (Mx+1) 272 has an edge 273, and via 250 has an edge 281 opposite edge 273 of metal line (Mx+1). Via 250 has a width W6. The distance between edge 273 and edge 281 is X.

Figure 3:
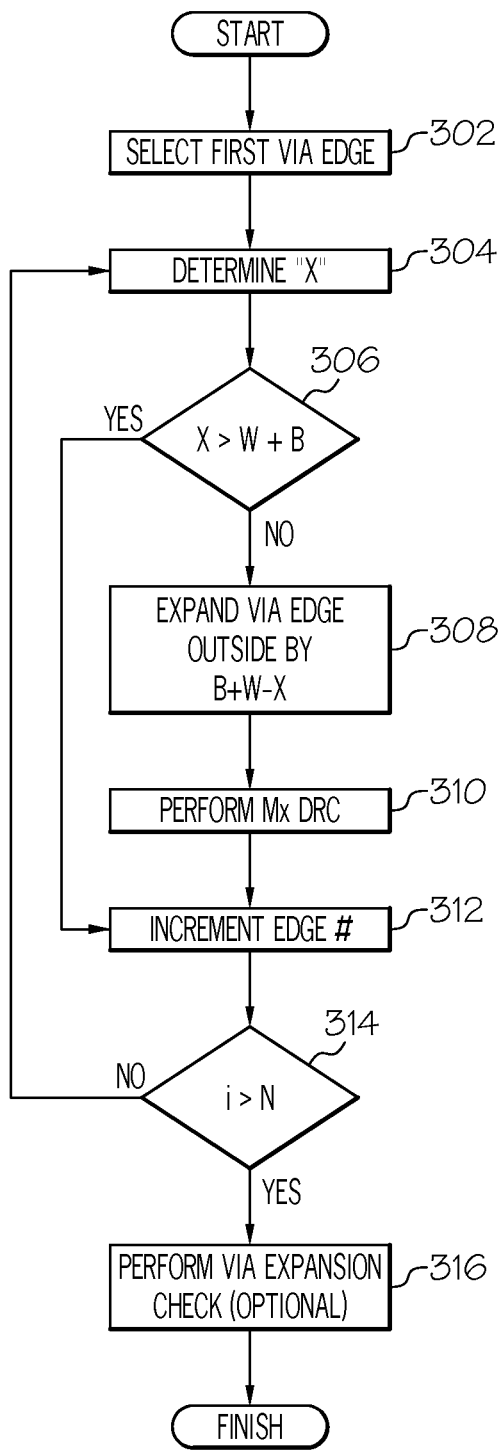
FIG. 3 is a flowchart indicating process steps for embodiments of the present invention.

FIG. 3 is a flowchart indicating process steps for embodiments of the present invention. At 302, a first via edge is selected. At 304, a distance between the selected via edge and the opposite parallel edge of the metal line (Mx+1) is determined (i.e., the value of "X" is determined). At 306, it is determined whether X is greater than the width of the selected via (W) plus the maximum bias (B). If no, then the process moves to block 308, where the selected via edge is expanded by an amount equal to B+W−X. At block 310, an Mx design rule check (DRC) is performed, and the process then moves to block 312. If, at block 306, the determination was yes, then the process moves directly to block 312. At block 312, the via edge number, i, is incremented, i.e., a next via edge is selected. At 314, it is determined whether the increment (i) is greater than the total number (N) of edges of the via. In embodiments, N may be 4. If the determination is that i is not greater than N, the process moves to block 304 to continue the process for such next edge. If the determination is that i is greater than N, then the process moves to block 316 for an optional via expansion check. The process then finishes.

FIGS. 4A-4C illustrate an exemplary retargeting process in accordance with illustrative embodiments. Referring now to FIG. 4A, a metal line (Mx+1) 402A is shown, having a width W7. In this example, the ideal via width is also W7. Thus, in the ideal case, the via 404A is located directly below metal line (Mx+1) 402A. However, due to overlay errors, this may not be the case in practice. Thus, the via retargeting in accordance with embodiments of the present invention is performed to enable sufficient via contact, even in the case of an overlay error. According to the algorithm as described for FIG. 3, starting with edge 404L of via 404A, measuring in the right direction, as indicated by arrow 410, the location of the opposite edge 402R of metal line (Mx+1) 402A is encountered before W+B (i.e., B1) is reached. Hence, a correction is applied, resulting in left expansion area 412 of FIG. 4B. Similarly, measuring from edge 404R of via 404A in the left direction, as indicated by arrow 408, the location of the opposite edge 402L of metal line (Mx+1) 402A is encountered before W+B (i.e., B2) is reached. Hence, a correction is applied, resulting in right expansion area 413 of FIG. 4B. Right expansion area 413 is bounded by right edge boundary 417. Similarly, left expansion area 412 is bounded by left via edge boundary 415. The newly sized (retargeted) via 404C is shown in FIG. 4C. The via 404C has an increased left and right edge boundary as compared with via 404A. Thus, in the event of overlay, sufficient contact between via 404C and metal line 402C is still maintained. Points 450A and 450B on FIG. 4A represent the points where X is greater than W+B in each of the lengthwise directions. Since the metal line (Mx+1) 402C is typically long, no correction is usually needed in the lengthwise direction.

Figure 5C:
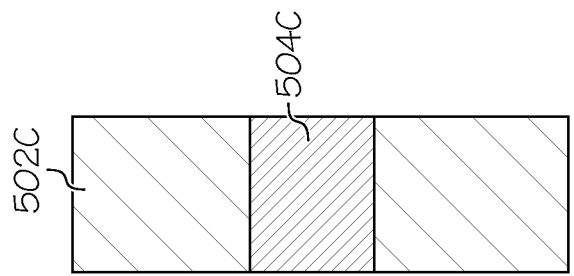
FIGS. 5A-5C illustrate an exemplary retargeting process in accordance with illustrative embodiments.
Figure 5B:
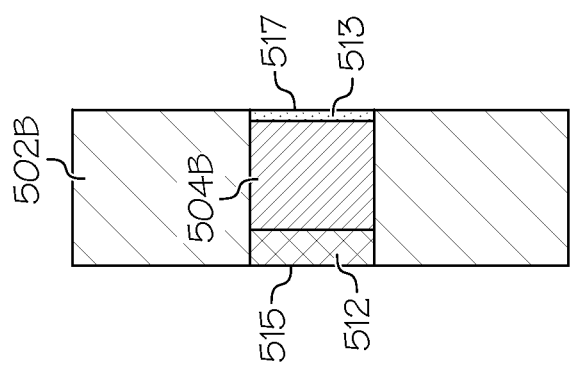
Figure 5A:
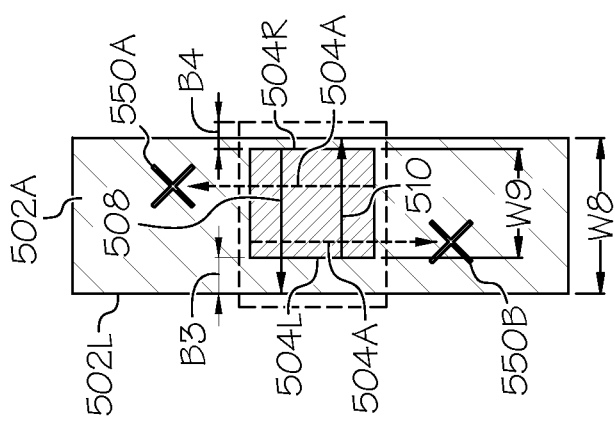

FIGS. 5A-5C illustrate an exemplary retargeting process in accordance with illustrative embodiments. FIGS. 5A-5C illustrate a scenario where the metal line (Mx+1) has a width W8, where W8 is larger than the ideal via 504A width W9. In this case, considering the overlay error, a correction is applied in both the left and right directions, but the correction is asymmetrical with respect to each direction as compared to the other. According to the algorithm as described in FIG. 3, in the right direction, as indicated by arrow 510, the location of the edge 502R (opposite from via edge 504L) is encountered before W (i.e., W8)+B (i.e., B4) is reached. Hence, a correction is applied, resulting in left expansion area 512 as depicted in FIG. 5B. Similarly, in the left direction, as indicated by arrow 508, the location of edge 502L (opposite from via edge 504L) is encountered before W (i.e., W8)+B (i.e., B3) is reached. Hence, a correction is applied, resulting in right expansion area 513 as depicted in FIG. 5B. Right expansion area 513 is bounded by right edge boundary 517. Similarly, left expansion area 512 is bounded by left via edge boundary 515. The newly sized (retargeted) via 504C is shown in FIG. 5C. The via 504C has an increased left and right edge boundary as compared with via 504A. Thus, in the event of overlay, sufficient contact between via 504C and metal line 502C is still maintained. It should be noted that points 550A and 550B on FIG. 5A represent the points where X is greater than W+B in each of the lengthwise directions. Since the metal line (Mx+1) 502C is typically long, no correction is usually needed in the lengthwise direction.

Figure 6C:
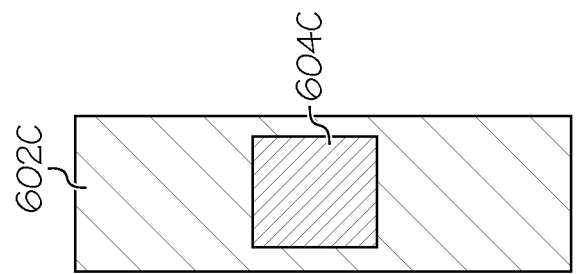
FIGS. 6A-6C illustrate an exemplary retargeting process in accordance with illustrative embodiments.
Figure 6B:
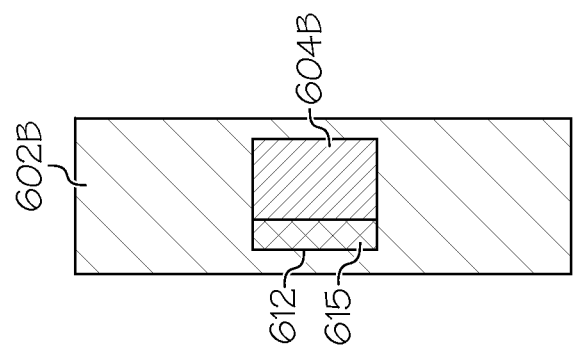
Figure 6A:
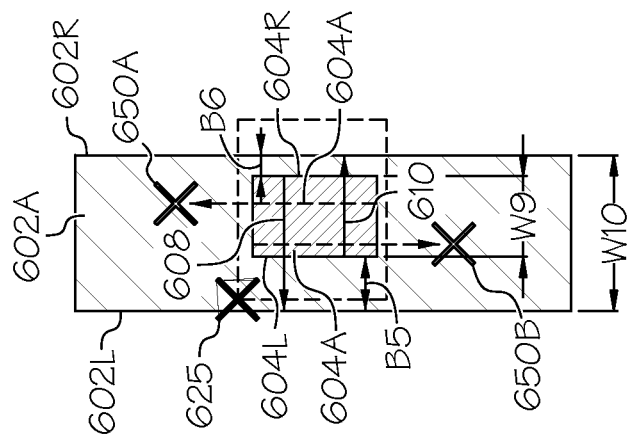

FIGS. 6A-6C illustrate an exemplary retargeting process in accordance with illustrative embodiments. FIGS. 6A-6C illustrate a scenario where the metal line (Mx+1) has a width W10, where W10 is larger than the ideal via 604A width W9. In this case, considering the overlay error, a correction is applied only to the left side. This is because the condition X>W+B is satisfied in the left direction (from edge 604L of via 604A to edge 602R of metal line (Mx+1) 602A). Thus, no correction is applied on the right side. See an approximate representation of X at 625 on FIG. 6A. According to the algorithm as described for FIG. 3, in the right direction, as indicated by arrow 610, the location of edge 602R (opposite from via edge 604L) is encountered before W (i.e., W9)+B (i.e., B6) is reached. Hence, a correction is applied, resulting in left expansion area 612, as shown in FIG. 6B. However, in the left direction, as indicated by arrow 608, the location of the edge 602L (opposite from via edge 604R) is not encountered before W (i.e., W9)+B (i.e., B5) is reached. Hence, no correction is applied as can be seen in FIG. 6B. Left expansion area 612 is bounded by left via edge boundary 615. The newly sized (retargeted) via 604C is shown in FIG. 6C. The via 604C has an increased left and edge boundary as compared with via 604A. Thus, in the event of overlay, sufficient contact between via 604C and metal line (Mx+1) 602 is still maintained. It should be noted that points 650A and 650B on FIG. 6A represent the points where X is greater than W+B in each of the lengthwise directions. Since the metal line (Mx+1) 602 is typically long, no correction is usually needed in the lengthwise direction.

FIGS. 7A-7D illustrate an exemplary Mx design rule check (DRC) process in accordance with illustrative embodiments. Top-down views of a semiconductor structure are shown in accordance with embodiments of the invention. The DRC includes measuring a distance from a closest edge of the via to a nearest Mx line, and performing a reduction of the closest edge of the via if the distance is less than a predetermined design rule value. An example of an application of the DRC is as follows. In FIG. 7A, contact metal line (Mx+1) 702 and neighbor metal line (Mx) 704 are shown disposed over a dielectric 706. A via 708A, prior to re-targeting, is shown disposed over metal line (Mx+1) 702. In FIG. 7B, via 708B is shown, which is a computed size after metal line (Mx+1) retargeting. Z represents a predetermined design rule value for the proximity of neighbor line (Mx) 704 and a closest edge 710 of via 708B nearest the neighbor line (Mx) 704 (not shown in FIG. 7B). In the example shown, it is determined that the distance between the via 708B and neighbor line (Mx) 704 is smaller than Z. Accordingly, as depicted in FIG. 7C, the process includes performing a backoff, such that portion 718 of via 708C is backed off (i.e., reduced) as it is determined that the distance between the closest edge of the via 708B and the nearest neighbor line (Mx) 704 is less than Z. FIG. 7D shows via 708D at its final computed size after metal line (Mx+1) retargeting and Mx design rule check process.

Figure 8C:
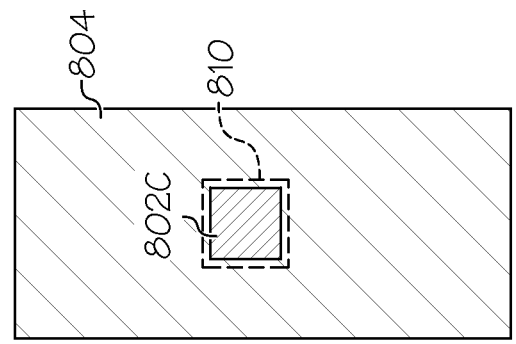
FIGS. 8A-8C illustrate an exemplary via expansion check process in accordance with illustrative embodiments.
Figure 8B:
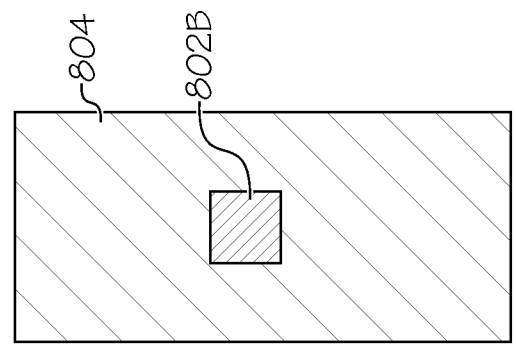
Figure 8A:
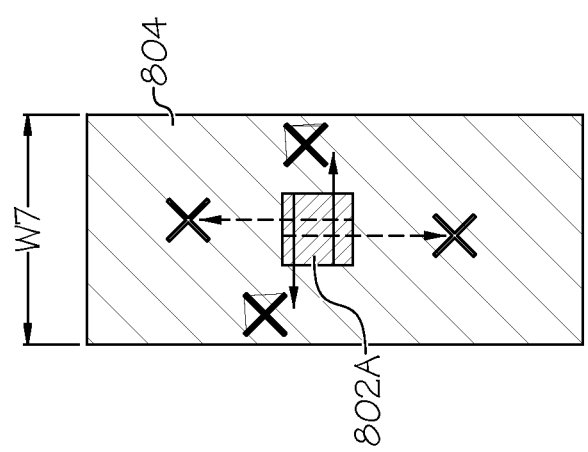

FIGS. 8A-8C illustrate an exemplary via expansion check process in accordance with illustrative embodiments. Bottom-up views of a semiconductor structure in accordance with embodiments of the present invention are shown. In this example, no metal line (Mx+1) retargeting was necessary because metal line (Mx+1) was considerably wider than the via. In some embodiments, the via may be expanded by a predetermined amount if the via is in an unadjusted state. In FIG. 8A, a via 802A is shown under a metal line (Mx+1) 804. Metal line (Mx+1) 804 has a width W7. In this example, W7 is considerably larger than a width W8 of the via. The Xs indicate that no adjustment of the via width by metal line (Mx+1) retargeting is necessary. In FIG. 8B, via 802B is shown with its size unchanged. In FIG. 8C, via 802C is shown with a box 810 representing a percentage increase in size. In some embodiments, expanding the via comprises expanding each edge of the via by an amount ranging from about 2 percent to about 4 percent. In some embodiments, expanding the via comprises expanding each edge of the via by an amount ranging from about 5 percent to about 10 percent.

Figure 9:
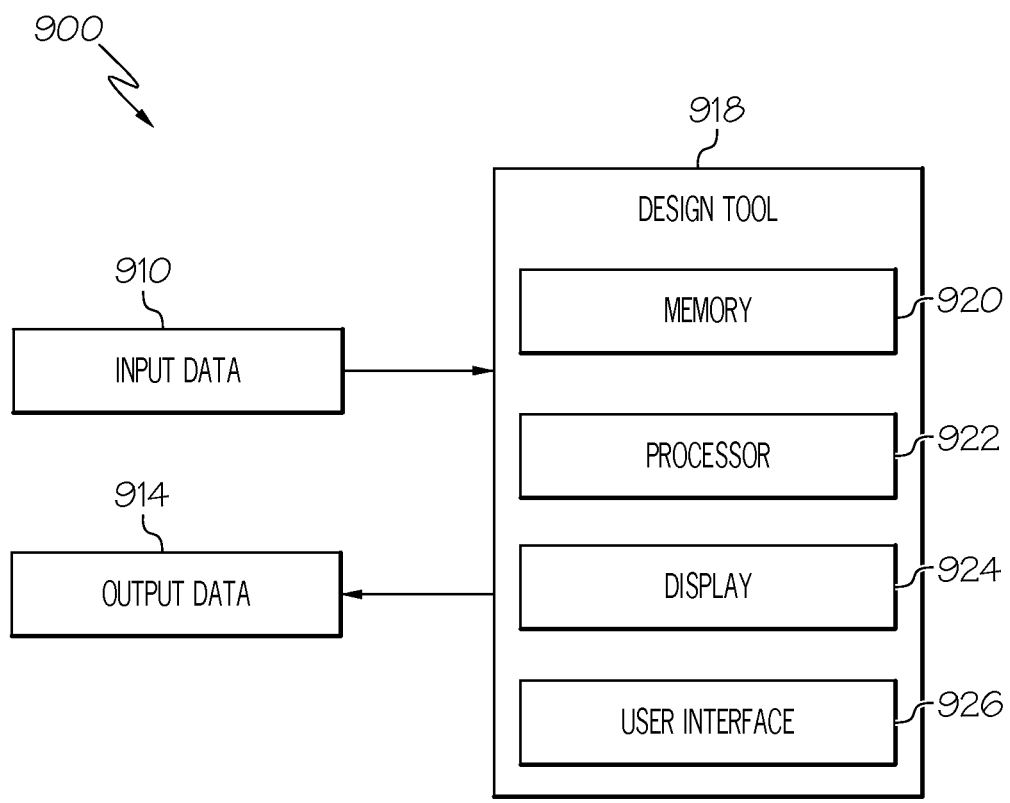
FIG. 9 is a system for implementation of embodiments of the present invention.

FIG. 9 is a system 900 for implementing illustrative embodiments. System 900 includes a design tool 918. Design tool 918 may be a computer comprising memory 920, and a processor 922 which is coupled to memory 920, such that the processor 922 may be configured to read and write memory 920. In some embodiments, multiple processors or cores may be used. The memory 920 may be a computer-readable medium, such as flash, ROM, non-volatile static ram, or other memory. In some embodiments, the memory 920 may be non-transitory. The memory 920 contains machine instructions that, when executed by processor 922, control the various subsystems to operate system 900. Design tool 918 may also include a display 924 and a user interface 926 for interacting with the system 900. The user interface 926 may include a keyboard, touch screen, mouse, or the like.

The design tool 918 may receive input data 910. Input data 910 may include a design structure, which may be a structure comprising a plurality of vias that undergo a retargeting process. The design structure may be a logical simulation design structure generated and processed by a design process to produce a logically equivalent functional representation of a hardware device. The design structure may also or alternatively include data and/or program instructions that when processed by design tool 918, generate a functional representation of the physical structure of a hardware device. The input data 910 may include hardware-description language (HDL) design entities or other data structures conforming to and/or compatible with lower-level HDL design languages such as Verilog and VHDL, and/or higher level design languages such as C, C++, or Python. Embodiments of the present invention may further include a computer program product embodied in a non-transitory computer-readable medium.

The design tool 918 may generate output data 914. The generated output data 914 may be in a stream format indicative of a structure comprising a plurality of retargeted vias. The output data may reside in a storage medium in a data format used for the exchange of layout data of integrated circuits (e.g., information stored in a GDSII (GDS2), GL1, OASIS, or any other suitable format for storing such design structures). Output data 914 may include information such as, for example, parameterized cells, test data files, design content files, manufacturing data, layout parameters, wires, middle of line (MOL) interconnect information, net lists, levels of metal, vias, contacts, shapes, data for routing through the manufacturing line, and any other data required by a semiconductor manufacturer to produce embodiments of the present invention.

In various embodiments, design tools can be provided and configured to create the datasets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLAs), logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

In some embodiments, the invention provides a computer-readable medium that includes for designing an integrated circuit, comprising instructions, which when executed by a processor (e.g., 922 of FIG. 9), performs the functionality disclosed herein. To this extent, the computer-readable medium includes instructions that implement each of the various processes of the invention. In some embodiments, the term computer-readable medium may comprise one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 920 (FIG. 9) and/or a storage system (e.g., a fixed disk, a read-only memory, a random access memory, a cache memory, etc.).

As can now be appreciated, embodiments of the present invention provide a system and method for via retargeting. An opposite edge distance is computed between a via edge and the opposite edge of its metal line (Mx+1). The opposite edge distance is used as a criterion in determining the amount and direction of retargeting. The disclosed approach reduces the variation in via size due to overlay, resulting in more uniformity and predictability in printing conditions, thus reducing device variability and improving yield.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Moreover, in particular regard to the various functions performed by the above described components (assemblies, devices, circuits, etc.), the terms used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application. Therefore, it is to be understood that the appended claims are intended to cover all such modifications and changes that fall within the true spirit of the invention.

What is claimed is:
1. A method, comprising:
   a) selecting a first edge of a via for manufacturing a semiconductor device, wherein the via comprises a plurality of edges;
   b) obtaining a maximum bias value for the via;
   c) obtaining a via width;

d) determining a distance from the first edge to an opposite parallel metal layer edge;

e) expanding the first edge of the via outward by an amount of the maximum bias value plus the via width minus the distance from the first edge to an opposite parallel metal layer edge in response to determining that the distance from the first edge to an opposite parallel metal layer edge is greater than the via width plus the maximum bias value; and f) repeating steps d) and e) at least once for each additional edge of the plurality of edges of the via.

2. The method of claim 1, wherein repeating steps d) and e) comprises repeating steps d) and e) for at least three additional edges.

3. The method of claim 1, further comprising:
measuring a distance from a closest edge of the via to a nearest metal layer line; and
performing a backoff of the closest edge of the via if the distance is less than a predetermined design rule value.

4. The method of claim 3, wherein the design rule value ranges from about 80 nanometers to about 120 nanometers.

5. The method of claim 1, further comprising expanding the via by a predetermined amount if the via is in an unadjusted state.

6. The method of claim 5, wherein expanding the via comprises expanding each edge of the via by an amount ranging from about 2 percent to about 4 percent.

7. The method of claim 5, wherein expanding the via comprises expanding each edge of the via by an amount ranging from about 5 percent to about 10 percent.

8. A system, comprising one or more processors coupled to memory containing machine instructions, that when executed by the one or more processors, perform the functions of:

a) selecting a first edge of a via that has a plurality of edges for manufacturing a semiconductor device;

b) obtaining a maximum bias value for the via;

c) obtaining a via width;

d) computing a distance from the first edge to an opposite parallel metal layer edge;

e) expanding the first edge of the via outward by an amount of the maximum bias value plus the via width minus the distance from the first edge to an opposite parallel metal layer edge in response to determining that the distance from the first edge to an opposite parallel metal layer edge is greater than the via width plus the maximum bias value; and f) repeating steps d) and e) at least once for each additional edge of the plurality of edges of the via.

9. The system of claim 8, wherein the memory further comprises instructions, that when executed by the one or more processors, perform functions of repeating steps d) and e) which comprises repeating steps d) and e) for three additional edges.

10. The system of claim 8, wherein the memory further comprises instructions, that when executed by the one or more processors, perform functions of:
measuring a distance from a closest edge of the via to a nearest metal layer line; and
performing a backoff of the closest edge of the via if the distance is less than a predetermined design rule value.

11. The system of claim 10, wherein the memory further comprises instructions, that when executed by the one or more processors, uses a design rule value that ranges from about 80 nanometers to about 120 nanometers.

12. The system of claim 8, wherein the memory further comprises instructions, that when executed by the one or more processors, expands the via by a predetermined expansion amount if the via is in an unadjusted state.

13. The system of claim 12, wherein the memory further comprises instructions, that when executed by the one or more processors, uses a predetermined expansion amount that ranges from about 2 percent to about 4 percent.

14. The system of claim 12, wherein the memory further comprises instructions, that when executed by the one or more processors, uses a predetermined expansion amount that ranges from about 5 percent to about 10 percent.

15. A computer program product embodied in a non-transitory computer-readable medium for designing an integrated circuit executed by a processor, comprising instructions for:

a) selecting a first edge of a via that has a plurality of edges for manufacturing an integrated circuit based on the designing;

b) obtaining a maximum bias value for the via;

c) obtaining a via width;

d) computing a distance from the first edge to an opposite parallel metal layer edge;

e) expanding the first edge of the via outward by an amount of the maximum bias value plus the via width minus the distance from the first edge to an opposite parallel metal layer edge in response to determining that the distance from the first edge to an opposite parallel metal layer edge is greater than the via width plus the maximum bias value; and f) repeating steps d) and e) at least once for each additional edge of the plurality of edges of the via.

16. The computer program product of claim 15, further comprising instructions for repeating steps d) and e) comprises repeating steps d) and e) for three additional edges.

17. The computer program product of claim 15, further comprising instructions for:
measuring a distance from a closest edge of the via to a nearest metal layer line; and
performing a backoff of the closest edge of the via if the distance is less than a predetermined design rule value.

18. The computer program product of claim 17, further comprising instructions for using a predetermined design rule value that ranges from about 80 nanometers to about 120 nanometers.

19. The computer program product of claim 15, further comprising instructions for expanding the via by a predetermined amount if the via is in an unadjusted state.

20. The computer program product of claim 19, further comprising instructions for expanding each edge of the via by an amount ranging from about 2 percent to about 4 percent.

* * * * *